US008025932B2

(12) United States Patent
Wolden et al.

(10) Patent No.: US 8,025,932 B2
(45) Date of Patent: Sep. 27, 2011

(54) SELF-LIMITING THIN FILM SYNTHESIS ACHIEVED BY PULSED PLASMA-ENHANCED CHEMICAL VAPOR DEPOSITION

(75) Inventors: Colin Wolden, Denver, CO (US); Michael T. Seman, Golden, CO (US)

(73) Assignee: Colorado School of Mines, Golden, CO (US)

( * ) Notice: Subject to any disclaimer, the term of this patent is extended or adjusted under 35 U.S.C. 154(b) by 775 days.

(21) Appl. No.: 12/026,056

(22) Filed: Feb. 5, 2008

(65) Prior Publication Data
US 2008/0199632 A1 Aug. 21, 2008

Related U.S. Application Data

(60) Provisional application No. 60/890,941, filed on Feb. 21, 2007.

(51) Int. Cl.
H05H 1/24 (2006.01)
(52) U.S. Cl. ........................................ 427/569; 427/576
(58) Field of Classification Search .................. 427/569, 427/576
See application file for complete search history.

(56) References Cited

U.S. PATENT DOCUMENTS

| | | | |
|---|---|---|---|
| 4,058,430 A | 11/1977 | Suntola et al. | |
| 5,344,792 A | 9/1994 | Sandhu et al. | |
| 5,470,668 A * | 11/1995 | Wu et al. | 428/688 |
| 6,265,038 B1 * | 7/2001 | Frisk | 428/34.7 |
| 6,451,390 B1 | 9/2002 | Goto et al. | |
| 6,616,986 B2 * | 9/2003 | Sherman | 427/562 |
| 6,689,220 B1 | 2/2004 | Nguyen | |
| 6,930,059 B2 * | 8/2005 | Conley et al. | 438/785 |
| 6,986,914 B2 * | 1/2006 | Elers et al. | 427/255.23 |
| 7,332,442 B2 * | 2/2008 | Vaartstra et al. | 438/758 |
| 7,341,959 B2 * | 3/2008 | Brcka | 438/758 |
| 7,741,202 B2 * | 6/2010 | Clark | 438/585 |
| 2003/0170482 A1 * | 9/2003 | Murakami | 428/615 |
| 2006/0021572 A1 | 2/2006 | Wolden | |

OTHER PUBLICATIONS

Seman, Michael, "Self-limiting growth of tantalum oxide thin films by pulsed plasma-enhanced chemical vapor deposition". Applied Physics Letters 90, 131504 (2007) pp. 1-3.*
Gall, D., et al., "Pulsed plasma deposition of chromium oxide/chromium-cermet coatings". J. Vac. Sci. Technol. A 14(2), Mar./Apr. 1996, pp. 374-379.*
Szymanski, Scott, et al., "Effect of wall conditions on the self-limiting deposition of metal oxides by pulsed plasma-enhanced chemical vapor deposition". J. Vac. Sci. Technol. A 25(6), Nov./Dec. 2007, pp. 1493-1499.*
Alén et al. (2006) "Diffusion Barrier Properties of Atomic Layer Deposited Ultrathin $Ta_2O_5$ and $TiO_2$ Films," *J. Electrochem. Soc.* 153(4):G304-G308.
Barnes et al. (2005) "Room Temperature Chemical Vapor Deposition of C-Axis ZnO," *J. Cryst Growth* 274:412-417.
Barnes et al. (Sep. 24, 2004) "ZnO Synthesis by High Vacuum Plasma-Assisted Chemical Vapor Deposition Using Dimethylzinc and Atomic Oxygen," *J. Vac. Sci. Technol. A* 22:2118-2125.
Bauer et al. (Oct. 6, 2005) "Growth Precursors for a-C:H Film Deposition in Pulsed Inductively Coupled Methane Plasmas," *J. Apple. Phys.* 98(7):073302.
Biebericher et al. (Apr. 10, 2000) "Deposition Rate in Modulated Radio-Frequency Silane Plasmas," *Appl. Phys. Lett.* 76(15):2002-2004.
Carcia et al. (2006) "Ca Test of $Al_2O_3$ Gas Diffusion Barriers Grown by Atomic Layer Deposition on Polymers," *Appl. Phys. Lett.* 89(3):031915.
Charles et al. (Jul. 1, 1998) "Stress Reduction in Silicon Dioxide Layers by Pulsing an Oxygen/Silane Helicon Diffusion Plasma," *J. Appl. Phys.* 84:350-354.
Cho et al. (Jun. 1, 2003) "Origin and Effect of Impurity Incorporation in Plasma-Enhanced $ZrO_2$ Deposition," *J. Appl. Phys.* 93:9345-9351.
Cho et al. (Dec. 13, 2004) "Comparison Between Atomic-Layer Deposited $HfO_2$ Films Using $O_3$ or $H_2O$ Oxidant and $Hf[N(CH_3)_2]_4$ Precursor," *Appl. Phys. Lett.* 85(24):5953-5955.
Cho et al. (2005) "Comparison of Properties of an $AL_2O_3$ Thin Layers Grown with Remote $O_2$ Plasma, $H_2O$, or $O_3$ as Oxidants in an ALD Process for $HfO_2$ Gate Dielectrics," *J. Electrochem. Soc.* 152(5):F49-F53.
Chwang et al. (Jul. 21, 2003) "Thin Film Encapsulated Flexible Organic Electroluminescent Displays," *Appl. Phys. Lett.* 83(3):413-415.
CompoundSemi News (2005) "Shakeup Expected in ALD Equipment Business," http://www.compoundsemi.com/documents/articles/news/5844.html.
Cutini, J. (Jul. 2005) "Atomic Layer Deposition Becomes the Next Imperative Technology," Wafer News http://www.solid-state.com/articles/article_display.html?id=232100.
Doe, P. (2008) "Aviza Rebuilding ALD Presence in Competitive Market, Part 2," http://www.solid-state.com/articles/article_display.html?id=211736.
Electronics.ca Research Network (Mar. 7, 2006) "The ALD Market will Cross $617 Million by 2010," http://www.electronics.ca/presscenter/articles/256/1/The-ALD-Market-Will-Cross-617-Million-By-2010/Page1.html.
Fujioka et al. (2006) "Large-Scale, High-Efficiency Thin-Film Silicon Solar Cells Fabricated by Short—Pulsed Plasma CVD Method," *Solar Energy Mat. Solar Cells* 90:3416-3421.

(Continued)

*Primary Examiner* — Bret Chen
(74) *Attorney, Agent, or Firm* — Greenlee Sullivan P.C.

(57) ABSTRACT

$Ta_2O_5$ and $Al_2O_3$ thin films were fabricated by pulsed plasma-enhanced chemical vapor deposition (PECVD) with simultaneous delivery of $O_2$ and the metal precursor. By appropriately controlling the gas-phase environment self-limiting deposition at controllable rates (~1 Å/pulse) was obtained. The process was insensitive to substrate temperature, with a constant deposition rate observed from 90-350° C. As-deposited $Ta_2O_5$ films under these conditions displayed good dielectric properties. Performance improvements correlate strongly with film density and composition as measured by spectroscopic ellipsometry and Fourier transform infrared spectroscopy. Pulsed PECVD eliminates the need for gas actuation and inert purge steps required by atomic layer deposition.

16 Claims, 8 Drawing Sheets

OTHER PUBLICATIONS

George et al. (1996) "Surface Chemistry for Atomic Layer Growth," *J. Phys. Chem.* 100:13121-13131.

Goodman et al. (Aug. 1, 1986) "Atomic Layer Epitaxy," *J. Appl. Phys.* 60(3):R65-R81.

Heil et al. (2006) "In situ Reaction Mechanism Studies of Plasma-Assisted Atomic Layer Deposition of $Al_2O_3$," *Appl. Phys. Lett.* 89(13):131505.

Higashi et al. (Nov. 6, 2003) "Sequential Surface Chemical Reaction Limited Growth of High Quality $Al_2O_3$ Dielectrics," *Appl. Phys. Lett.* 55(19):1963-1965.

Jezewski et al. (2005) "Inductively Coupled Hydrogen Plasma-Assisted Cu ALD on Metallic and Dielectric Surfaces," *J. Electrochem. Soc.* 152(2):C60-C64.

Jiang et al. (Sep. 1, 2003) "Aluminum-Doped Zinc Oxide Films as Transparent Conductive Electrode for Organic Light Emitting Devices," *Appl. Phys. Lett.* 83(9):1875-1877.

Katsch et al. (Dec. 1, 2000) "Detection of Atomic Oxygen: Improvement of Actinometry and Comparison with Laser Spectroscopy," *J. Appl. Phys.* 88(11):6232-6238.

Kim et al. (2003) "Characteristics of Tungsten Carbide Films Prepared by Plasma-Assisted ALD Using bis)tert-butylimido)bis-(dimethylamido)tungsten," *J. Electrochem. Soc.* 150(10):C740-C744.

Kim et al. (Dec. 1, 2002) "Improvement in $Al_2O_3$ Dielectric Behavior by Using Ozone as an Oxidant for the Atomic Layer Deposition Technique," *J. Appl. Phys.* 92(11):6739-6742.

Kukli et al. (May 1995) "Atomic Layer Epitaxy Growth of Tantalum Oxide Thin Films from $Ta(OC_2H_5)_5$ and $H_2O$," *J. Electrochem. Soc.* 142(5):1670-1675.

Labelle et al. (1999) "Pulsed Plasma-Enhanced Chemical Vapor Deposition from $CH_2F_2$, $C_2H_2F_4$, and $CHClF_2$," *J. Vac. Sci Technol. A* 17(2):445-452.

Lao et al. (2005) "Plasma Enhanced Atomic Layer Deposition of $HfO_2$ and $ZrO_2$ High-k Thin Films," *J. Vac. Sci. Technol. A* 23(3):488-496.

Lee et al. (1995) "Global Model of Ar, $O_2$, $Cl_2$, and $Ar/O_2$ High Density Plasma Discharges," *J. Vac. Sci. Technol. A* 13(2):368-380.

Lee et al. (Jun. 1994) "Global Model of Plasma Chemistry in a High Density Oxygen Discharge," *J. Electrochem. Soc.* 141(6):1546-1555.

Lee et al. (2004) "Photo-Induced Atomic Layer Deposition of Tantalum Oxide Thin Films from $Ta(OC_2H_5)_5$ and $O_2$," *J. Electrochem. Soc.* 151(1):C52-C55.

Lim et al. (Nov. 2003) "Atomic Layer Deposition of Transition Metals," *Nature Mater.* 2:749-754.

Look et al. (1998) "Electrical Properties of Bulk ZnO," *Solid State Commun.* 105(6):399-401.

Mackie et al. (1997) "Comparison of Pulsed and Continuous-Wave Deposition of Thin Films from Saturated Fluorocarbon/$H_2$ Inductively Coupled rf Plasmas," *Chem. Mater.* 9:349-362.

Maeng et al. (2006) "Thermal and Plasma-Enhanced ALD of Ta and Ti Oxide Thin Films from Alkylamide Precursors," *Electrochem. Solid-State Lett* 9(6):G191-G194.

Masuda et al. (Feb. 1, 2003) "Transparent Thin Film Transistors Using ZnO as an Active Channel Layer and Their Electrical Properties," *J. AppL Phys.* 93(3):1624-1630.

Mukherjee et al. (Jan. 8, 1996) "Optoelectronic Properties of Hydrogenated Amorphous Silicon Films Grown Using a Modified Pulsed Plasma Discharge," *Appl. Phys. Lett.* 68(2):194-196.

Niskanen et al. (2005) "Low-Temperature Deposition of Aluminum Oxide by Radical Enhanced Atomic Layer Deposition," *J. Electrochem. Soc.* 152(7):F90-F93.

Ono et al. (Sep. 4, 2000) "Infrared Absorption Peak Due to Ta=O bonds in $Ta_2O_5$ Thin Films," *Appl. Phys. Lett.* 77(10):1431-1433.

Ott et al. (1997) "Modification of Porous Alumina Membranes Using $Al_2O_3$ Atomic Layer Controlled Deposition," *Chem. Mater.* 9(3):707-714.

Overzet et al. (Mar. 17, 1986) "Enhancement of the Plasma Density and Deposition Rate in rf Discharges," *Appl. Phys. Lett.* 48(11):695-697.

Park et al. (2004) "Plasma-Enhanced ALD of Titanium-Silicon-Nitride Using $TiCl_4$, and $N_2/H_2$/Ar Plasma," *Electrochem. Solid-State Lett.* 7(8):C87-C89.

Park et al. (2005) "Ultra Thin Film Encapsulation of Organic Light Emitting Diode on a Plastic Substrate," *ETRI J.* 27(5):545-550.

Puurunen, R.L. (2005) "Surface Chemistry of Atomic Layer Deposition: A Case Study for the Trimethylaluminum/Water Process," *J. Appl. Phys.* 97:121301.

Ritala et al. (2000) "Atomic Layer Deposition of Oxide Thin Films with Metal Alkoxides as the Oxygen Source," *Science* 288:319-321.

Robbins et al. (2001) "Development of Tin Oxide Synthesis by Plasma-Enhanced Chemical Vapor Deposition," *J. Vac. Sci. Technol. A* 19(6):2762-2766.

Robbins et al. (2004) "An Interrogation of the Zinc Oxide—Gallium Oxide Phase Space by Plasma Enhanced Chemical Vapor Deposition," *J. Crystal Growth* 263:283-290.

Robbins et al. (2003) "An Investigation of the Plasma Chemistry Involved in the Synthesis of ZnO by Plasma-Enhanced Chemical Vapor Deposition," *J. Electrochem. Soc.* 150(10):C693-C698.

Robbins et al. (2005) "Transport Phenomena in High Performance Nanocrystalline ZnO:Ga Films," *Thin Solid Films* 473:35-40.

Seman et al. (2003) "Investigation of the Role of Plasma Conditions on the Deposition Rate and Electrochromic Performance of Tungsten Oxide Thin Films," *J. Vac. Sci. Technol. A* 21(6):1927-1933.

Seman et al. (2005) "An Investigation of the Role of Plasma Conditions n the Deposition Rate of Electrochromic Vanadium Oxide Thin Films," *J. Non-Cryst. Solids* 351:1987-1994.

Sneh et al. (2002) "Thin Film Atomic Layer Deposition Equipment for Semiconductor Processing," *Thin Solid Films* 402:248-261.

Szymanowski et al. (2005) "Optical Properties and Microstructure of Plasma Deposited $Ta_2O_5$ and $Nb_2O_5$ Films," *J. Vac. Sci. Technol. A* 23(2):241-247.

Vernhes et al. (Spe. 28, 2006) "Pulsed Radio Frequency Plasma Deposition of $a$-$SiN_x$:H Alloys: Film Properties, Growth Mechanism, and Applications," *J. Appl. Phys.* 100(6):063308.

Yang et al. (2006) "Plasma-Enhanced Chemical Vapor Deposition of $TiO_2$ Thin Films for Dielectric Applications," *Thin Solid Films* 515:1708-1713.

Yun et al. (1997) "Dependence of Atomic Layer Deposited $Al_2O_3$ Film Characteristics on Growth Temperature and Al Precursors $Al(CH_3)_3$ and $AlCl_3$," *J. Vac. Sci Technol. A* 15(6):2993-2997.

"OLED Replacing LCDs in Mobile Phones," http://www.edn.com/index.asp?layout=article&articleid=CA516009 (Apr. 4, 2005).

Kubala et al. (Apr. 28, 2009) "Self-Limiting Deposition of Anatase $TiO_2$ at Low Temperature by Pulsed PECVD," *Electrochem. Solid-State Lett.* 12(7):H259-H262.

Seman et al. (Web Release Mar. 29, 2007) "Self-Limiting Growth of Tantalum Oxide Thin Films by Pulsed Plasma Enhanced Vapor Deposition," *Appl. Phys. Lett.* 90:131504.

Szymanski et al. (Jul. 1, 2008) "Self-Limiting Deposition of Aluminum Oxide Thin Films by Pulsed Plasma-Enhanced Chemical Vapor Deposition," *J. Vac. Sci. Technol. A* 26(4):1079-1084.

Szymanski et al. (Web Release Apr. 29, 2007) "Plasma and Gas-Phase Characterization of a Pulsed Plasma-Enhanced Chemical Vapor Deposition System Engineered for Self-Limiting Growth of Aluminum Oxide Thin Films," *Surf. Coat. Technol.* 201:8991-8997.

Rowlette et al. (Web Release Apr. 8, 2009) "Digital Control of $SiO_2$ Film Deposition at Room Temperature," *J. Phys. Chem. C, Lett.* 113:6906-6909.

Rowlette et al. (Web Release Oct. 19, 2009) "Digital Control of $SiO_2$-$TiO_2$ Mixed-Metal Oxides by Pulsed PECVD," *Appl. Mater. Interfaces* 1(11):2586-2591.

* cited by examiner

SELF-LIMITING THIN FILM SYNTHESIS ACHIEVED BY PULSED PLASMA-ENHANCED CHEMICAL VAPOR DEPOSITION

CROSS-REFERENCE TO RELATED APPLICATIONS

This application claims priority to U.S. provisional application Ser. No. 60/890,941 filed Feb. 21, 2007 which is incorporated herein by reference to the extent not inconsistent herewith.

STATEMENT REGARDING FEDERALLY SPONSORED RESEARCH OR DEVELOPMENT

This invention was made with government support under contract no. 0093611 and IIP0637406 awarded by the National Science Foundation. The government has certain rights in the invention.

BACKGROUND

Plasma-enhanced chemical vapor deposition (PECVD) is an established technique for thin film synthesis due to its ability to deliver high rates at low thermal budget. PECVD offers a suite of parameters, including pulsed power modulation (Overzet, L. J. and Verdeyen, J. T., 1986), that can be tailored to meet specific demands. Pulsed PECVD has been adopted for silicon (Biebericher, A. C. W., et al. 2000) and carbon-based (Mackie, N. M., et al. 1997; Bauer, M., et al. 2005) materials, with demonstrated improvements in composition (Labelle, C. B., and Gleason, K. K. 1999), rate (Overzet, L. J. and Verdeyen, J. T.; Biebericher, J., et al. 2000), and performance (Mukherjee, C., et al., 1995; Fujioka, Y., et al., 2006). In the case of oxides most pulsed PECVD work has been directed at $SiO_2$, where its attributes include improved uniformity, reduced film stress, and enhanced dielectric performance (Charles, C. 1998; Goto, H. H., 2002).

Metal oxide thin films serve as high κ replacements for $SiO_2$ (Maeng, W. J. and Kim, H. 2006; Cho, M., et al. 2004), and as diffusion barriers (Carcia, P. F., et al. 2006). Atomic layer deposition (ALD) is an attractive technique due to its potential to deliver high quality films with monolayer thickness control. In metal oxide ALD, a precursor and an oxidizer are sequentially exposed to a heated substrate, separated by inert gas purges. Although ALD has been demonstrated for nearly every metal oxide (George, S. M., et al. 1996; Puurunen, R. L., 2005), the surface chemistry of the metal precursor can often be the rate-limiting step in both the thermal and plasma-assisted modes. Species with low reactivity require large exposures to achieve surface saturation and steric effects can limit surface coverage for large precursors. Metal ligands are a leading source of impurities that impact performance. Finally, monolayer deposition is usually limited to a small (~100° C.) temperature range. For example, in $Ta_2O_5$ ALD using penta-ethoxy tantalum (PET, $Ta(OC_2H_5)_5$) and $H_2O$, self-limiting growth is achieved between 225-300° C., rates are ~0.4 Å/cycle, and the resulting films are poor dielectrics with leakage current densities >1 $mA/cm^2$ at 1 MV/cm electric field (Kukli, K., et al, 1995; Lee, Y. H. et al., 2004).

Atomic layer deposition (ALD) was discovered almost 30 years ago (Suntola, T. and Anston, J., 1977), but only in the past decade has it risen to prominence as increasing performance requirements have demanded the control and quality at the nanoscale that only ALD can provide. Since its inception, ALD researchers have focused on the chemical aspects of this process. They have identified numerous combinations of reactants (George, S. M., et al. 1996), developed new classes of metal precursors (Lim, B. S., et al., 2003; Maeng, W. J. and Kim, H., 2006), and explored numerous oxidizing agents (Ritala, M., et al., 2003; Cho, M., et al., 2005). In general, the basic process has remained unchanged, employing the A/purge/B/purge sequence where 50-90% of the total cycle time is spent on purge steps.

Figure 1:
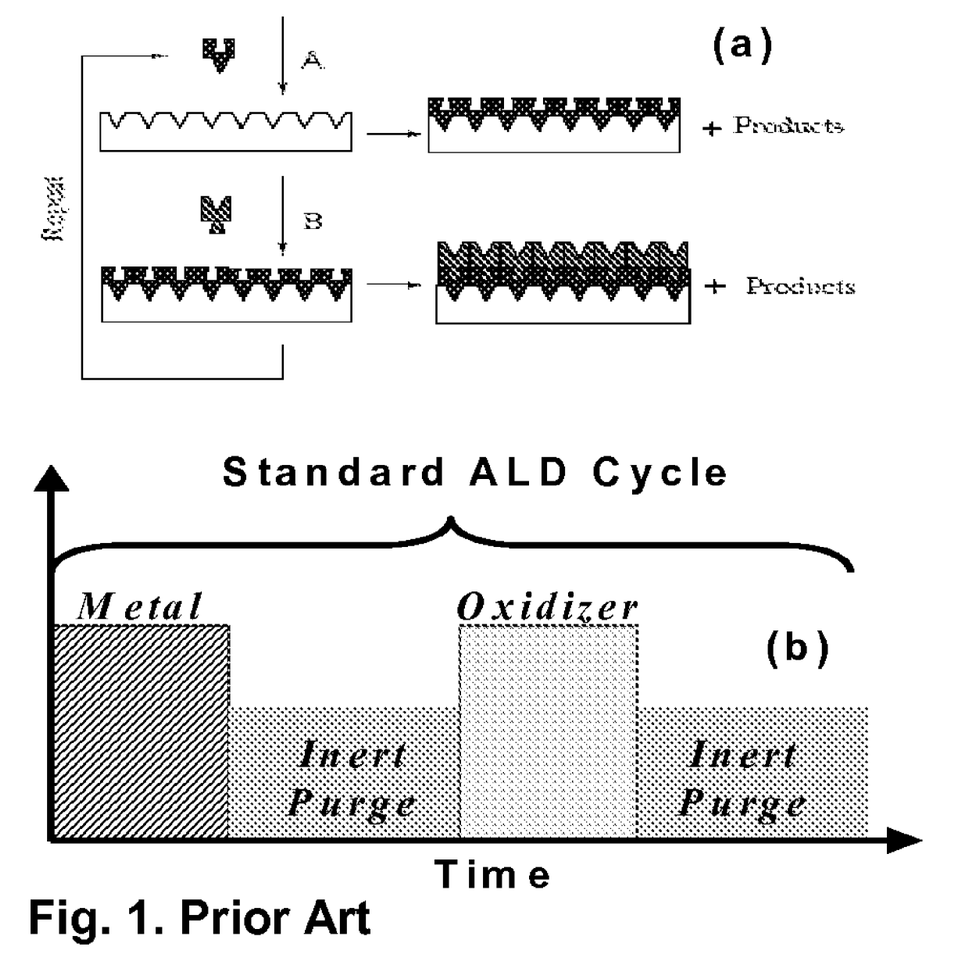

Atomic layer deposition is a process that provides monolayer control to chemical vapor deposition (CVD) processes (George, S. M., et al. 1996; Goodman, C. H. L. and Pessa, M. V., 1986). ALD has been used to deposit metals (Jezewski, C., et al., 2005), oxides (Lai, S. X., et al., 2005, nitrides (Park, J-S, and Kang, S.-W., 2004), and carbides (Kim, D. H., et al. 2003). The process involves alternating exposure to two different reactants as shown in FIG. 1. In the case of metal oxides, precursor A is typically an organometallic precursor that saturates the surface with a monolayer of coverage. Reactant B is an oxidizer ($H_2O$, $O_3$, O) that removes the organic ligands and converts the adsorbed metal into a film. Both reactions are self-limiting, and the process is repeated with films grown one monolayer at a time.

This process provides exceptional quality and precise control over film thickness. The self-limiting nature of the reactions ensures large area uniformity, and conformal coverage on complex structures has been achieved. It is critical that the two reactants do not meet, and in order to prevent gas-phase chemistry the two are separated using inert purge cycles as shown in FIG. 1b. The process requires complex mechanical actuation of flow rates, and expends significant quantities of carrier gas. The purge cycles can be rather long, particularly when using low volatility precursors and/or employing water as the oxidizer. A typical commercial process may require ~5 s/cycle. Combined with deposition rates of ~1 Å/cycle the overall deposition rates remains quite low (~1 nm/min). The present proposal advocates a simpler process that offers much higher rates through reduced cycle times while maintaining ALD quality and control.

The fast growing ALD market is on its way to becoming a billion dollar/year industry (Electronics.ca Research Network, 2003). One large growth area for ALD is the manufacturing of organic light emitting diode (OLED) displays. These displays are currently finding growing market share as replacements for liquid crystal technology in mobile phones and mp 3 players (reed-electronics.com, 2005). In 2005, 61 million OLED display units were produced, a market growth of 65 percent. By 2011, the OLED market is expected to reach 341 million units valued at $2.9 billion. The use of metal oxide barriers such as $Al_2O_3$ deposited by ALD dramatically reduces up water vapor penetration that is detrimental to OLED lifetime (Park, S. H. K., et al., 2005). Additionally, the ALD growth of high κ dielectrics and semi-conducting oxides could improve the performance of thin film transistors (TFT) that switch these devices (Carcia, P. F., et al., 2006).

ALD is used extensively to deposit thin films for both microelectronic and optoelectronic applications. The need for ALD will continue to grow as device dimensions and tolerances continue to shrink. A $1 billion dollar industry in 2005, it is expected to grow to $2.9 B by 2011. ALD provides unparalleled quality and thickness control, however its low deposition rates (~1 nm/min) preclude ALD from competing with conventional thermal and plasma-enhanced chemical vapor deposition (CVD/PECVD) techniques in a number of markets. Leading commercial ALD systems require cycle times of ~5 s. A method is needed to decrease this value by an order of magnitude, and reap the commensurate increase in throughput.

SUMMARY OF THE INVENTION

A pulsed PECVD process is provided that displays self-limiting growth during both the plasma off and plasma on stages. By appropriate control of operating parameters film thickness and quality can be controlled at the angstrom or molecular level. This invention provides a revolutionary approach to enhance ALD deposition rates and throughput. Based on a fundamental understanding of conventional PECVD processes, we have developed a dramatically simple deposition process in which purge cycles and gas-actuation are eliminated. Through proper control of kinetic and transport time scales ALD-type behavior is achieved through pulsed-PECVD operation. The elimination of purge cycles enables the increase of net deposition rates by as much as an order of magnitude.

A pulsed plasma-enhanced chemical vapor deposition (PECVD) process is provided for depositing a thin film of a metal, metal oxide, metal nitride or metal carbide on a substrate. The process comprises: providing at least one gaseous, metal-containing precursor compound to a PECVD reactor; providing to said reactor at least one additional gaseous reactant material; and pulsing a power supply to said reactor to produce plasma and to create a power cycle consisting of a plasma OFF time and a plasma ON time; under conditions selected such that no deposition would occur if the plasma OFF time were continuous; and no deposition would occur if the plasma ON time were continuous.

The metal-containing precursor and reactant material should be continuously supplied to the reactor.

The term thin film refers to films having a single-layer thickness of one molecule, e.g., one angstrom, up to films having thicknesses of several angstroms, up to about one micron. The thickness of the layer deposited during each pulse can be controlled by the methods of this invention. For example, a single pulse could deposit a layer of a thickness of only one molecule, and a series of such pulses could deposit layers of any desired thickness. This allows very sensitive control of the thickness of the resulting thin film. Alternatively, a single pulse could deposit a layer of 10 angstroms thickness, and to build up a layer of the same thickness this method would require many fewer cycles, and thus process time would be shorter.

The metal-containing precursor can be any such precursor known to the art, for example as disclosed in Puurunen, R. L. 2005. Typical precursors include organometallic compounds, metal halides, and metal hydrides. Combinations of precursors can be used, typically combinations of precursors containing about two to about four metals. The precursors should be capable of being in the gas phase at temperatures of about 200° C. or less.

The gaseous reactant material is at least one gas containing an element selected from the group consisting of oxygen, hydrogen, nitrogen, and carbon. For example when it is desired to deposit a metal oxide on the substrate, the gaseous reactant material could be oxygen or an oxygen-containing gas. If it is desired to deposit a metal on the substrate, the gaseous reactant material could be hydrogen. If it is desired to deposit a metal nitride on the substrate, the gaseous reactant material could be ammonia or other nitrogen-containing gas. If it is desired to deposit a metal carbide on the substrate, the gaseous reactant material could be methane or other carbon-containing gas. Combinations of these gaseous reactant materials may be employed to achieve desired thin film compositions.

The plasma is generated in a PECVD reactor by means known to the art, for example by supplying power in the form of radio frequency, microwave, electron cyclotron resonance, direct current, and other means known to the art. Reactors suitable for generating plasma using any of these means are known to the art.

Reactor conditions must be such that the metal-containing precursor(s) must not react thermally with the other gaseous reactant(s) in the reactor if the plasma OFF time were continuous. The choice of conditions is a function of the precursor and reactant material composition, but typically involves low pressure, short residence times, and low temperature, and combinations of any of the foregoing.

It is important that the conditions are also selected such that the precursor compound is completely reacted with the reactant material during said plasma ON time; such that self-limiting deposition occurs during said plasma ON time. Typically, these conditions involve high concentrations of the gaseous reactant material, e.g., oxygen, high power, and short residence time.

A cycle time of five seconds is typical, but in embodiments of this invention cycle times are one second or less, and include cycle times of 0.1 second or less.

Any substrate known to the art can be used for the deposition of the thin films of this invention (Puurunen, R. L., 2005), including silicon, glass, metal and plastic.

The substrate can be structured, i.e., can have hills and valleys, plateaus and depressions, and the like.

The process is useful in many industrial processes, e.g., to make semiconductor layers, high-κ dielectric layers, barrier layers, and integrated circuits to name only a few.

Using fundamental reactor engineering principles the standard PECVD process has been engineered to provide ALD control through pulsed power modulation. This approach dramatically simplifies ALD processing by eliminating both purge steps and the need for mechanical flow rate actuation. Since purging comprises 50-90% of a typical ALD cycle, deposition rate enhancements of up to an order of magnitude may be achieved. This invention allows synthesizing barrier layers and semiconductors on a variety of substrates including polymers.

The process simplifications and rate enhancements provided by the present invention will strengthen the areas of manufacture of vital electronic components such as organic light emitting diodes and thin film transistors, materials for encapsulation, high-☐ dielectrics, and a variety of other electronic materials, and open new markets such as barrier coating in applications ranging from food packaging to medical instrumentation.

Like ALD, pulsed PECVD can display self-limiting growth when two criteria are met. The first requirement is that no thermal CVD occurs when the metal precursor(s) and gaseous reactant(s) are mixed together. For example, in metal oxide synthesis molecular $O_2$ is much less reactive than $O_3$ or $H_2O$. As a result, no deposition is observed when certain metal precursors and $O_2$ are simultaneously exposed to various substrates at the combination of low pressure, temperature, and residence time that characterizes PECVD systems.

The second criterion for self-limiting growth is to select a plasma environment such that no deposition occurs during continuous plasma operation. In previous work on metal oxide PECVD we have noted the similarities between these systems and combustion, with the organometallic precursor serving as the fuel (Robbins, J. J., et al, 2003; Yang, W. and Wolden, C. A., 2006). The deposition rate attenuates with O atom density, which has been attributed to oxidation of the precursor in the plasma phase (Wolden, C. A., 2005). This concept may be taken to the extreme by using a combination of high $O_2$ flow rates and radio frequency (rf) power to create an environment in which the precursor is completely oxidized before reaching the substrate. Under these conditions the substrate is exposed to stable combustion products and a high flux of atomic O, and no deposition occurs.

Under the conditions described above, both the plasma-on and the plasma-off steps are self-limiting. While no deposition occurs under continuous operation, deposition is readily achieved by simply pulsing the plasma between on and off states. The absence of purge cycles and gas actuation is a great simplification with respect to ALD, and enables significant reductions in cycle time and a commensurate increase in net deposition rate. Below, we demonstrate that straightforward control of deposition kinetics can be achieved by manipulation of simple process parameters in the case of tantalum oxide synthesis. Process-structure-performance relationships are illustrated by comparisons of Fourier transform infrared (FTIR) spectra and refractive index with the leakage current behavior in metal-insulator-silicon (MIS) capacitors.

Without wishing to be bound by any particular theory, the inventors postulate that in pulsed PECVD deposition could proceed through one of the following two mechanisms. It could be similar to ALD in that the metal is supplied by precursor absorption during the plasma off cycle, and then converted into the desired film during the plasma on cycle. Alternatively it may proceed through deposition of an activated species present at the initiation of each pulse. Furthermore, it may be likely that growth results due to contributions from both of these two mechanisms.

BRIEF DESCRIPTION OF THE FIGURES

FIG. 1. (a) Schematic of the self-limiting ALD process and (b) a typical ALD cycle.

DETAILED DESCRIPTION

Atomic layer deposition (ALD) is a premier synthesis technique for thin film synthesis due to its ability to deliver high quality with monolayer control over film thickness. In metal oxide ALD, a metal precursor and an oxidizer are sequentially exposed to a heated substrate, separated by inert gas purges. In a related technique, plasma-assisted atomic layer deposition (PA-ALD), plasma activation of the oxidizer is employed. ALD has been demonstrated for nearly every metal oxide, displaying excellent performance in both dielectric and barrier applications.

Despite its advantages, there are shortcoming to ALD that have limited its application. First, the requirement of mechanical gas actuation makes ALD more complex that PECVD. Second, in many systems the overall deposition rates are quite low due to long purge cycles. Finally, the surface chemistry of the metal precursor can often be the rate-limiting step in both the thermal and plasma-assisted modes. Species with low reactivity require large exposures to achieve surface saturation and steric effects can limit surface coverage for large precursors. Metal ligands are a leading source of impurities that impact performance. Finally, monolayer deposition is usually limited to a small (~100° C.) temperature range.

Pulsed PECVD both simplifies the system and offers the potential for much higher rates/throughput while delivering the same high film quality and control. In pulsed PECVD all reagents are delivered continuously and cycle times are controlled by electronically pulsing the plasma. The need for purge cycles and mechanical gas actuation are eliminated, greatly simplifying the process. Without purge steps the total cycle time is reduced, which translates directly into enhanced net growth rates. In conventional ALD there have been extensive efforts to improve the time response of valves used to actuate the gas flow rates, but they have not addressed the fundamental issue of eliminating the need for alternating gas flows.

Both ALD and PA-ALD are controlled exclusively by the surface kinetics of the metal precursor. This is not the case in pulsed PECVD as the precursor may be activated at the initiation of each pulse. Important benefits arising from this difference include: More efficient precursor utilization; the use of precursors that are unreactive in conventional ALD environments; the use of less expensive precursors; the range of substrate temperatures employed can be greatly expanded, and most importantly lowered, with pulsed PECVD; since the pulsed cycle can be controlled electronically not mechanically, the pulse sequence can be controlled with a much higher degree of precision (orders of magnitude) with respect to duty cycle and pulse rate. In addition, pulsed PECVD is inherently compatible with standard PECVD, used widely for bulk film growth.

There are many applications that would benefit from the natural synergies that result from using pulsed PECVD for interface engineering and standard PECVD for bulk film growth. The process has widespread applicability: The process can be adapted to any metal precursors, including oxides, as well as certain noble metals, and to a much broader suite of compounds including nitrides, semiconductors, carbides and other metals.

Pulsed PECVD itself is not a new technique, and indeed it is used extensively in microelectronics to improve film quality, uniformity, reduce stress, etc. These applications can be found in a preliminary review of the patent literature (Goto et al. (2002); Nguyen, T. et al. (2004). This invention is distinguished from previous work with pulsed plasmas by our demonstration that self-limiting growth can be inherently achieved during both the plasma on and plasma off steps; and we use this to obtain Å-level control over both rate and film thickness, attaining film compositions and dielectric performance that are comparable or superior to what has been achieved using ALD.

Figure 2:
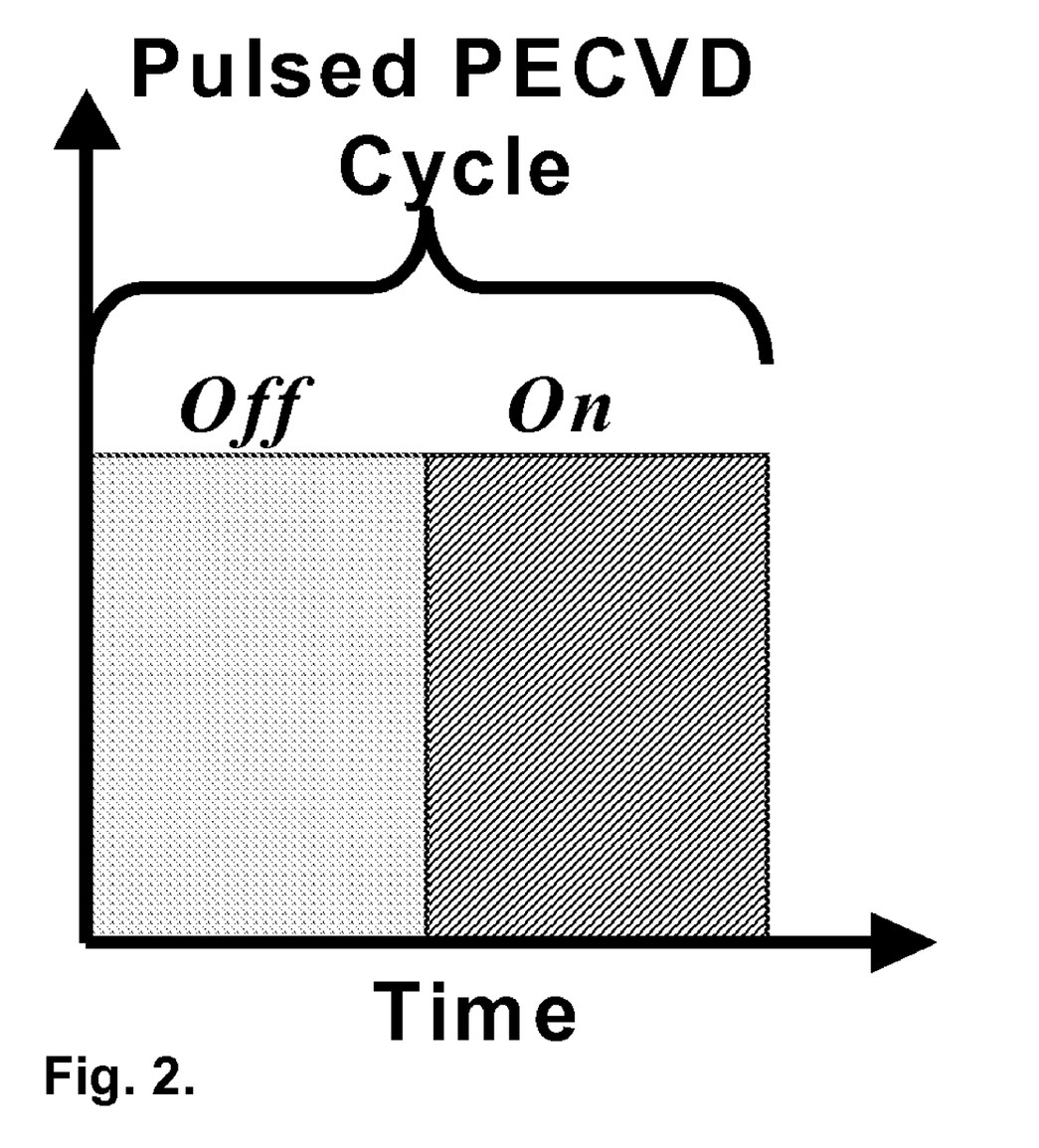
FIG. 2. Pulsed PECVD cycle.

In pulsed PECVD we pursue an alternative route to achieve self-limiting growth. The pulsed PECVD cycle sequence is shown in FIG. 2. In pulsed PECVD of metal oxides both $O_2$ and the precursor are supplied continuously to the system. A key to the process is to recognize that molecular oxygen does not react with many organometallic precursors, particularly at the low pressures and temperatures employed in plasma-assisted ALD. Conditions are chosen such that the following behavior is observed:
   During continuous operation with the plasma on: No Deposition
   During continuous operation with the plasma off: No Deposition
   Operation with the plasma pulsed: Deposition
   Compared to traditional ALD (see FIG. 1) pulsed PECVD offer numerous advantages, prominent among them include:
   Simplicity: Continuous, no actuation of flow rates
   Employs standard PECVD configurations which have been highly optimized for uniformity
   No purges=No wasted gas=Shorter Cycles=Faster Deposition Rates
   Uses O atom as oxidizer, which has been shown to provide higher rates and enable lower substrate temperatures than in standard ALD (W. J. Maeng and H. Kim (2006); M. Cho, et al. (2005).
However, in order to take advantage of these features one must ensure that ALD control and quality are maintained. We demonstrate below how this can be achieved.

EXAMPLES

Deposition Kinetics in the Pulsed PECVD of Tantalum Oxide

Figure 3:
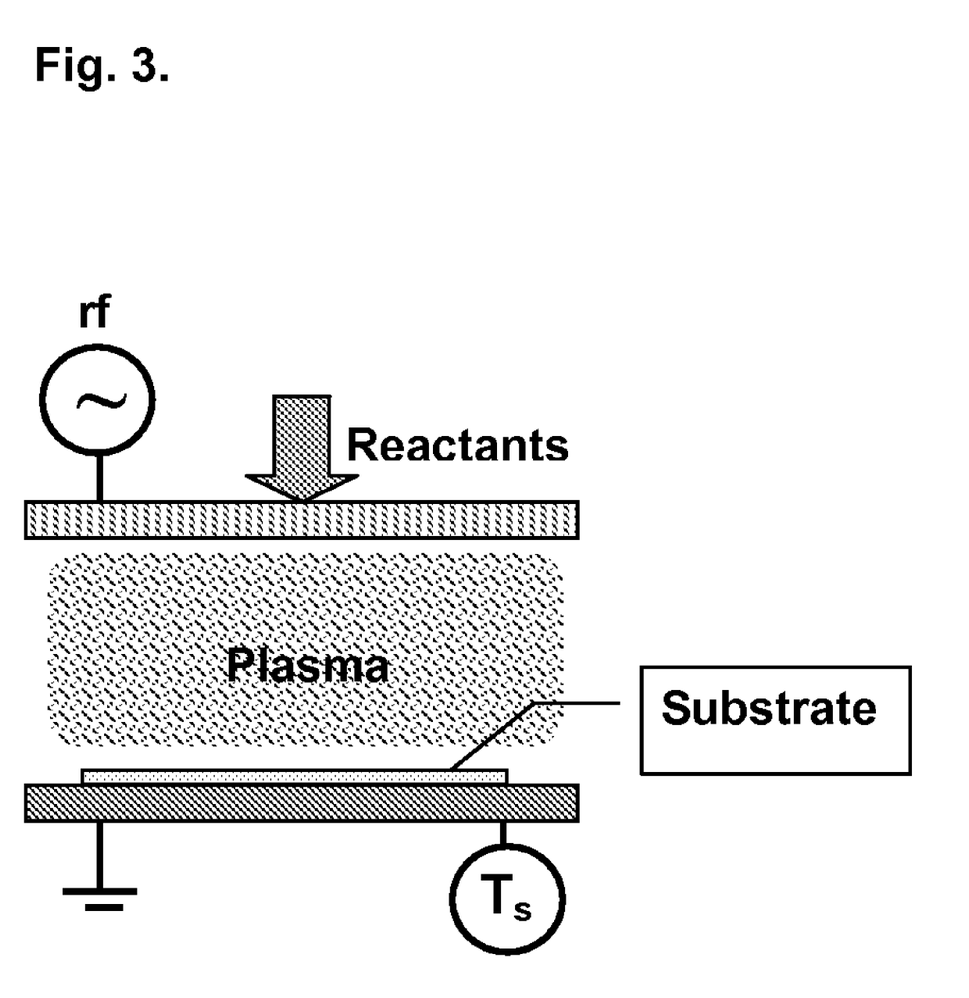
FIG. 3. Schematic diagram of capacitively-coupled reactor used for pulsed PECVD synthesis of tantalum oxide.

The films were deposited in a custom built, parallel plate, capacitively coupled rf PECVD reactor shown in FIG. 3. Single crystal (100) n-type silicon wafers were used as substrates. The Si wafers were degreased in methanol and chemically etched with dilute HF solution prior to loading into the deposition chamber to remove native $SiO_2$. The precursor employed was penta-ethoxy tantalum (PET, $Ta(OC_2H_5)_5$), which was housed in a temperature-controlled bubbler and delivered using argon as a carrier gas. Stoichiometric combustion of PET requires 15 oxygen molecules as described below:

$$Ta(OC_2H_5)_5 + 15\ O_2 \rightarrow \tfrac{1}{2}Ta_2O_5 + 10\ CO_2 + 12.5\ H_2O \qquad (1)$$

During pulsed PECVD the reactor was operated at very fuel lean conditions ($O_2$:PET>>15). PET was stored in a temperature-controlled bubbler (90-130° C.) and delivered through heated lines using 30 sccm of Ar. PET was mixed with 150 sccm of $O_2$ and delivered continuously through a showerhead, which also served as the powered electrode. Chamber pressure (600 mTorr) and rf power (100 W) were held constant. Deposition occurred on Si wafers clamped to the grounded electrode that was resistively heated. Film thickness and refractive index were measured by spectroscopic ellipsometry. All films were deposited to a thickness of a ~100 nm, which allowed direct comparison of optical and electrical properties among samples. Ellipsometry and FTIR measurements were performed on as-deposited samples before forming MIS capacitors using Al evaporation. The devices were tested using standard C-V and I-V measurements.

The kinetics of the pulsed PECVD process were examined as a function of plasma on time ($t_{on}$), off time ($t_{off}$), and precursor concentration ($M_o$) at $T_s$=190° C. The deposition rate was found to be independent of $t_{on}$ for values ≧1 s. This indicates that plasma oxidation of PET is relatively fast, and not rate-limiting under these conditions. As shown below, to a first approximation it was found that the deposition rate scales with the density of precursor present in the chamber at the end of the plasma off step, $M_{off}$. Treating the low-pressure reactor as a well-mixed system, the precursor concentration in the chamber as a function of $t_{off}$ may be described as $$\text{Rate} \propto M_{off} = M_o(1-\exp(-t_{off}/\tau)) \qquad (2)$$

where t is the residence time of the reactor, which was estimated to be t~5 s based on the reactor volume and flow rates employed.

Figure 4:
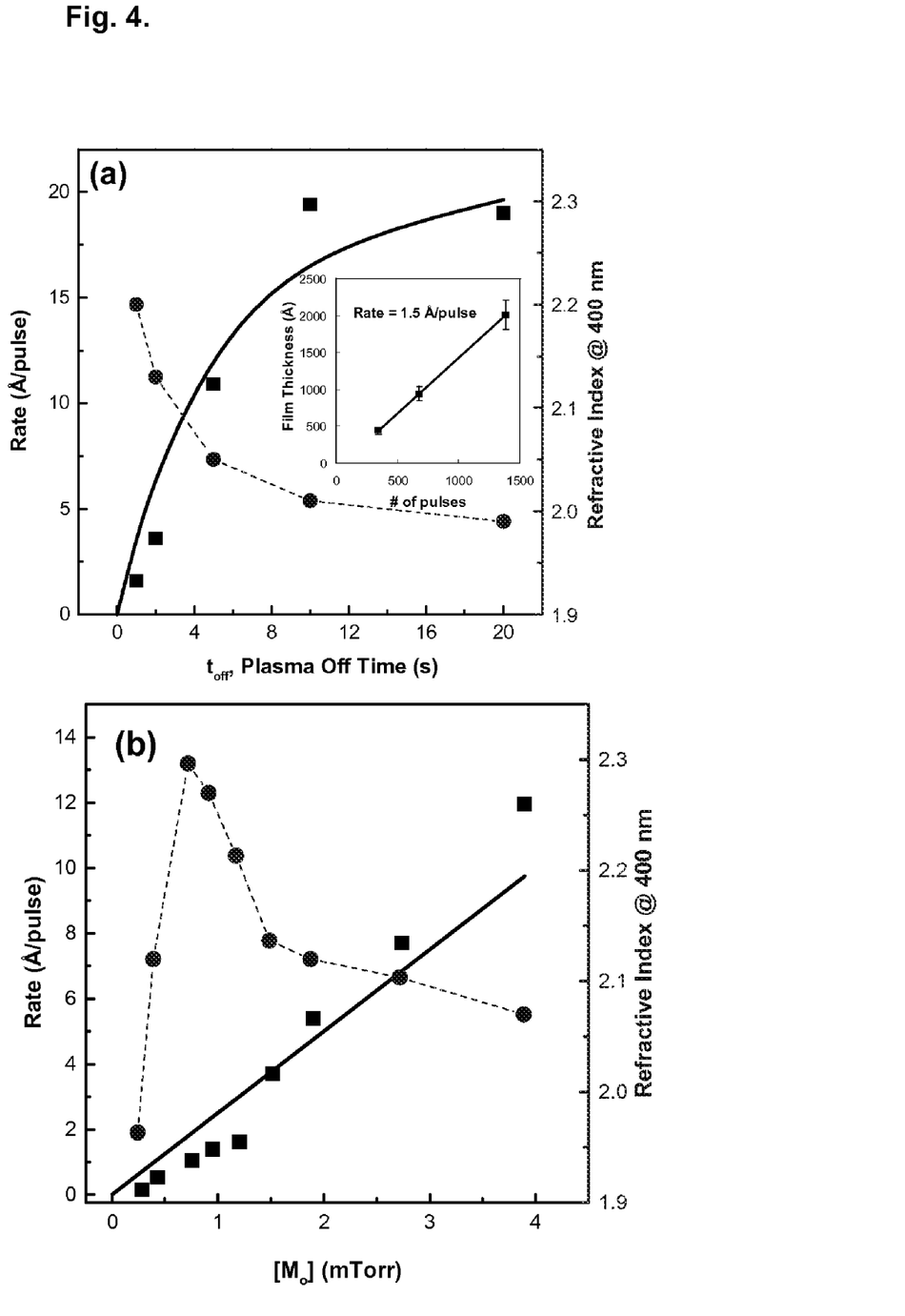
FIG. 4. $Ta_2O_5$ deposition rate per pulse (squares) and refractive index (circles) as a function of (a) $t_{off}$ at $[M_o]$=2.3 mTorr and (b) $[M_o]$ at $t_{off}$=2 s. The solid line is the scaling predicted by Eq. (1). Inset): Film thickness vs. number of pulses at constant $t_{off}$, $[M_o]$.

For a fixed residence time, Eq. (2) shows that the precursor concentration and rate can be manipulated by adjusting $t_{off}$ and/or $M_o$. Indeed, the deposition rate was found to be a strong function of these variables as shown in FIG. 4. The rate increases sharply with off time before saturating for $t_{off}$>10 s (FIG. 12a). This data is in good agreement with the general scaling predicted by Eq. (3), which is shown by the solid lines in FIG. 4. Deviations from the model may be attributed to imperfect mixing in the system. The range of refractive indices (2.0-2.3) is consistent with literature reports for $Ta_2O_5$ (Kukli, K., et al, 1995; Lee, Y. H., et al., 2004). As the deposition rate increased the film quality declined, as measured by the refractive index and electrical performance.

ALD-like rates of ~1 Å/pulse were obtained at short off times, however the saturated rate of 19 Å/pulse is much greater than expected for monolayer deposition. While Eq. (2) predicts an exponential dependence on $t_{off}$, it suggests a linear relationship with precursor concentration that is confirmed by the data in FIG. 4b. In these experiments $t_{on}$=$t_{off}$=2 s, while the PET partial pressure was adjusted by varying the bubbler temperature. In this experiment the refractive index displays a maximum at a rate of ~1 Å/pulse. The decline at higher rates may be related to impurity incorporation as shown below, while the inferior behavior at low rates may be similar to declines in quality observed in ALD when not operated at full surface saturation (Puurunen, R. L., 2005).

Figure 5:
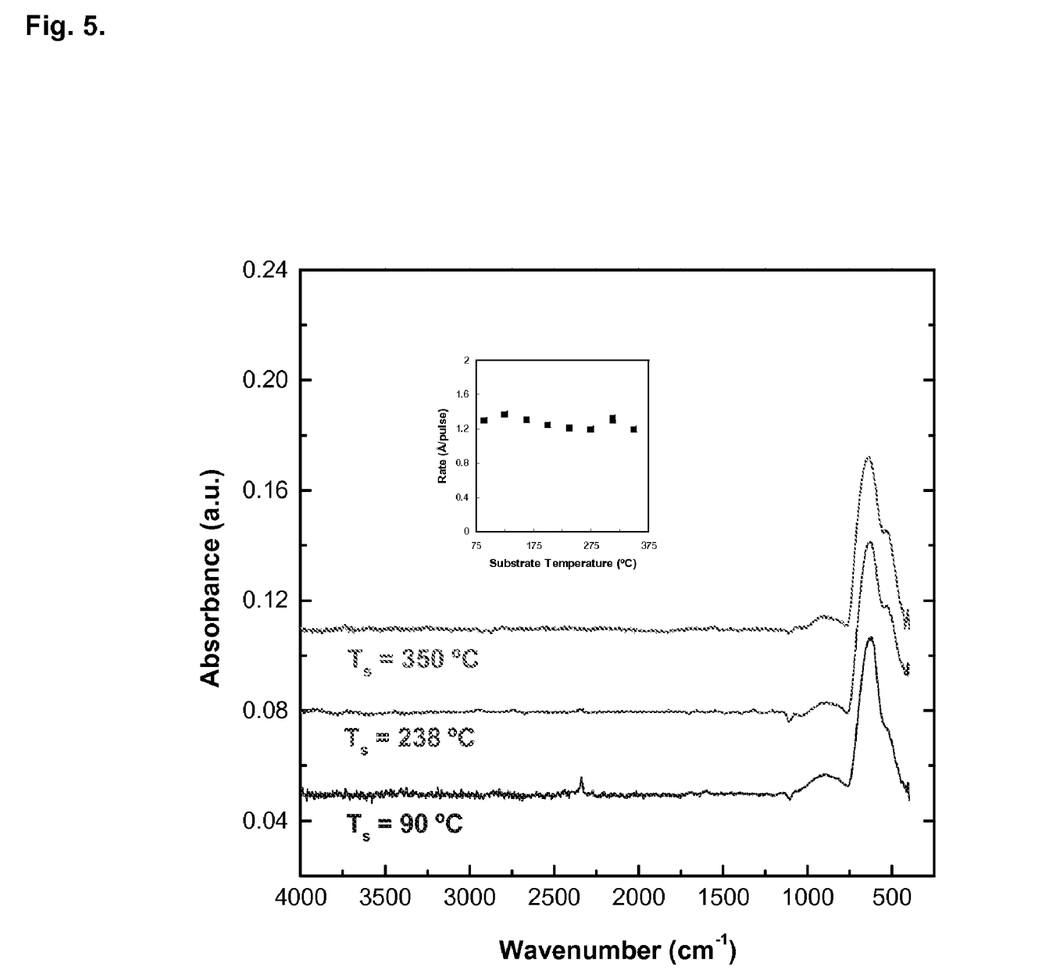
FIG. 5. FTIR spectra of pulsed PECVD $Ta_2O_5$ films at selected substrate temperature. Inset: Deposition rate of $Ta_2O_5$ as a function of substrate temperature.

It should be stressed that pulsed PECVD is not ALD, however it may be engineered to deliver similar properties and performance. In ALD deposition occurs exclusively through self-limiting surface reactions. In pulsed PECVD, without wishing to be bound by any particular theory of operation, we postulate that the metal may be supplied either by precursor absorption during the plasma off cycle, or by deposition of activated species present at the initiation of each pulse. The latter appears to be more important, which is supported by the process' insensitivity to the substrate temperature. FIG. 5 plots the deposition rate (inset) and selected FTIR spectra from a series of films in which only the substrate temperature was varied. The rate was nearly constant at 1.3 Å/pulse over the full range, and there was little change in the FTIR spectra (discussed in detail below).

This temperature window is much broader than observed in thermal ALD (Kukli, K., et al. 1995), and the minimum of 90° C. compares quite favorably with the values of 150° C. reported from UV and plasma-assisted ALD (Maeng, W. J., and Kim, H., 2006; Lee, Y. H., et al. 2004). Regardless of the specific mechanism, the important point is that the deposition rate varies monotonically with both $t_{off}$ and $M_o$ in a predictable fashion. With these parameters fixed, the linear relationship between film thickness and pulse number characteristic of ALD is obtained as shown in the inset of FIG. 4a.

We show that dramatic improvements in film purity and dielectric performance were obtained by controlling the deposition rate using the two parameters ($t_{off}$, $M_o$) described above. The process-structure-performance relationships are displayed in FIG. 6 by comparing FTIR spectra and leakage current data obtained from pulsed PECVD films fabricated at $T_s=190°$ C. The major features in the FTIR spectra are highlighted in FIG. 6a. All films display the well-known phonon bands at low wave numbers associated with Ta—O bonded in multiple coordination structures (Ono, H. and Koyanagi, K., 2000). FTIR reveals the two impurities common to PECVD films, hydroxyl groups and carbon. The OH groups lead to broad absorption in the 2800-3600 cm$^{-1}$ region while bands around 1500 cm$^{-1}$ are attributed the symmetric and asymmetric stretching modes of bidentate-type complexes that form when ligands are not completely removed (Szymanowski, H., et al., 2005; Cho, B-O, et al., 2003). Lastly, some films display a sharp peak at ~2340 cm$^{-1}$ that was recently identified as a Ta=O double bond stretch (Ono, H., and Koyanagi, K., 2000). Care was taken to clarify that this signal was not from gas-phase $CO_2$, which is supported by the absence of the $CO_2$ wagging mode at 670 cm$^{-1}$.

The composition of the pulsed PECVD films varies dramatically with deposition rate. At high rates (e.g. 6.2 Å/pulse) there is significant incorporation of both OH and carbon, and high leakage currents are observed. However, the impurity signals attenuate quickly as the deposition rate is reduced, and are not detectable in films deposited at rates $\leq 2.1$ Å/pulse. The FTIR spectrum from the film deposited at 1 Å/pulse shows only $Ta_2O_5$ phonon bands and a weak Ta=O stretch. Note that the spectra shown in FIG. 5 for films synthesized as a function of substrate temperature at 1.3 Å/pulse are very consistent with this film.

Figure 6:
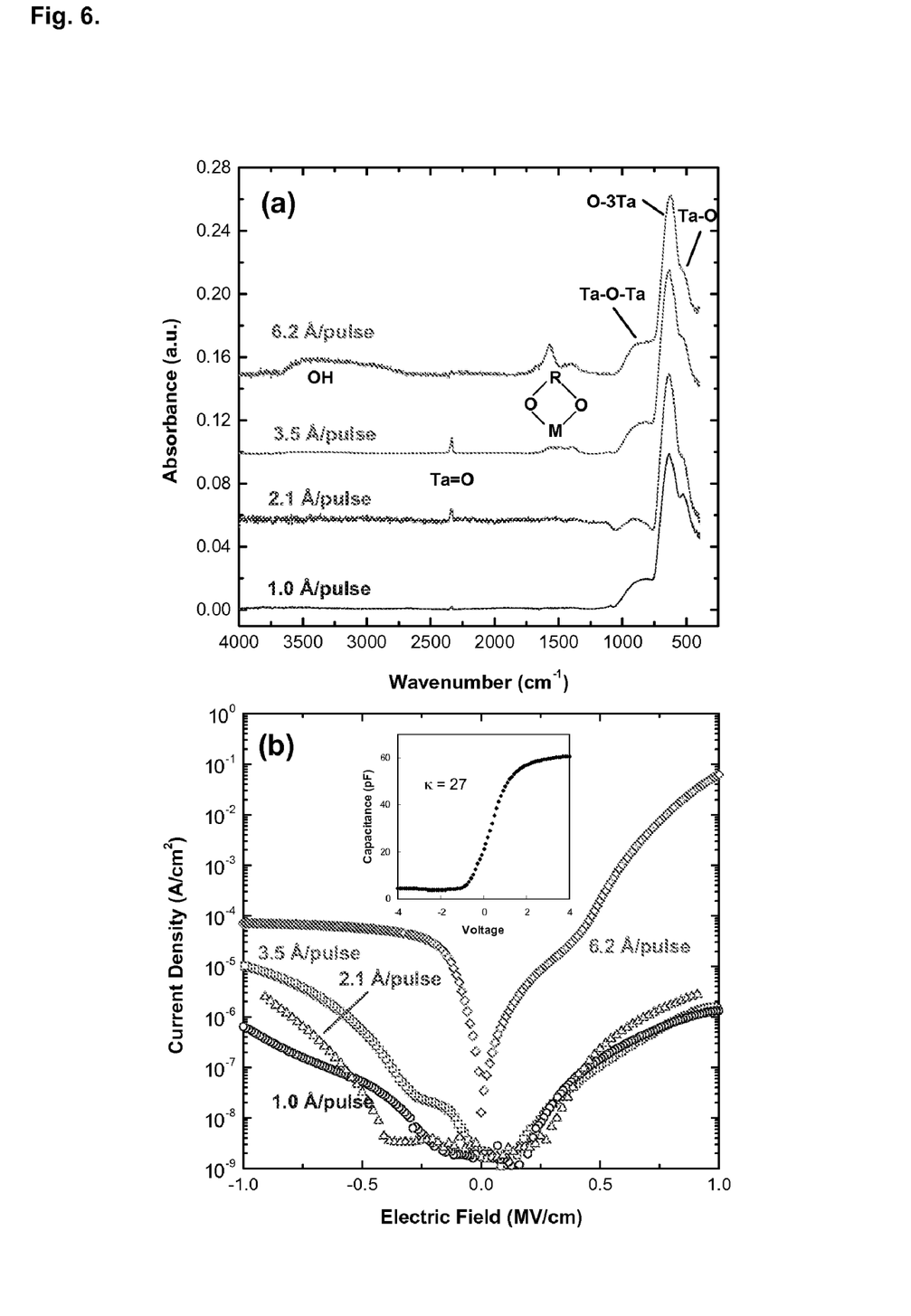
FIG. 6. (a) FTIR spectra of pulsed PECVD $Ta_2O_5$ films as a function of deposition rate, and (b) leakage current from capacitors made from these samples. Inset: C-V curve from the 1 Å/pulse film.

Improvements in purity are reflected in device performance as shown in FIG. 6b. The leakage current density for films deposited at $\leq 3.5$ Å/pulse remains below 1 mA/cm$^2$ up to a field strength of 1 MV/cm. The dielectric constant was less sensitive to process conditions, with values ($\kappa$=22-27) similar to ALD reports (Kukli, K., et al., 1995; Lee, Y. H., et al., 2004). This level of overall dielectric performance is far superior to thermal ALD (Kukli, K., et al., 1995), and comparable to the best reports from UV/plasma-assisted ALD systems (Maeng, W. J., and Kim, H., 2006; Lee, Y. H., et al., 2004).

Pulsed PECVD Synthesis of Aluminum Oxide

Figure 7:
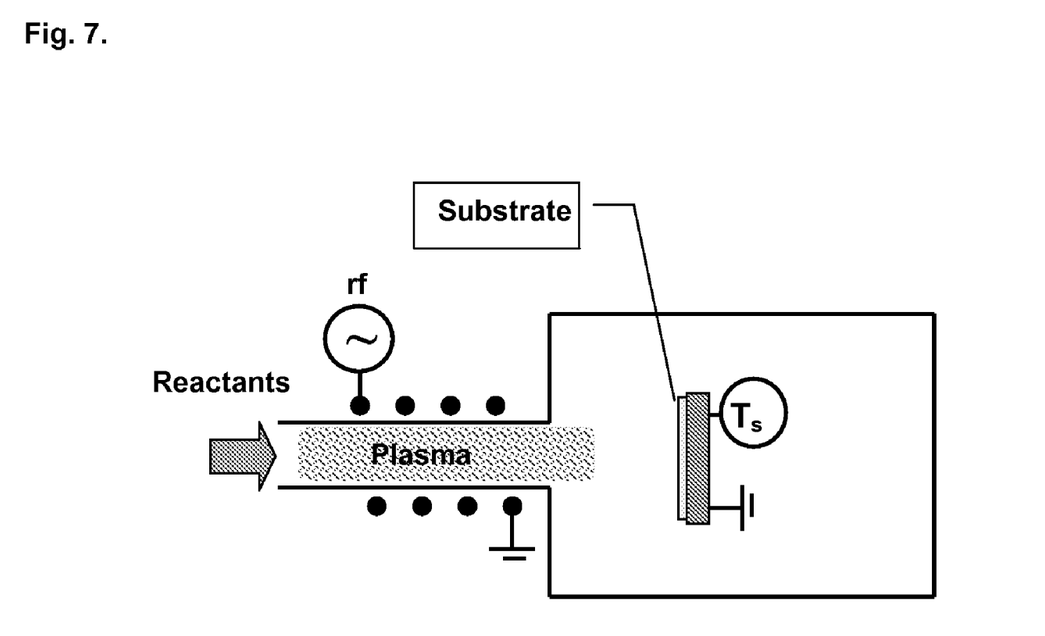
FIG. 7. Schematic diagram of inductively-coupled reactor used for pulsed PECVD synthesis of aluminum oxide.

As a second example we have employed pulsed PECVD for the synthesis of alumina ($Al_2O_3$) thin films at room temperature. This example shows the flexibility of pulsed PECVD, as there are significant differences between this system and the one used to deposit the tantalum oxide films. First, this reactor employed an inductively coupled source, with rf energy being supplied to coil surrounding a glass tube as shown in FIG. 7. Second, this is a downstream flow configuration with the plasma generated in the tube, and deposition occurring on a substrate placed downstream of the plasma. In contrast, the $Ta_2O_5$ films were synthesized in a capacitively coupled reactor in which the substrate is directly exposed to the plasma (FIG. 3). Lastly, this employed a different metal precursor, which in this case was trimethyl aluminum (TMA, $Al(CH_3)_3$). For the experiments described below the reactor pressure was 85 mTorr and the rf power was 100-200 W. TMA was stored in a bubbler at −1° C., and the TMA flowrate was controlled by altering the pressure of the bubbler between 10-100 torr using a needle valve. Ar was used as a carrier gas with a constant flowrate of 15 sccm. The Ar/TMA mixture was mixed with 50 sccm of $O_2$ and delivered into the reactor shown in FIG. 7. Silicon substrates were mounted on a susceptor that was maintained at room temperature.

Despite the substantial differences in chemistry and process configuration, the alumina system has been engineered to deliver the same basic principles as described above for $Ta_2O_5$. Specifically we have attained the following characteristics:

No film deposition is observed under continuous operation with the plasma OFF

No film deposition is observed under continuous operation with the plasma ON

Self-limiting film deposition is readily achieved by pulsing the plasma between the ON/OFF states The deposition rate per pulse may be readily controlled by adjusting process variables such as ON time, OFF time, and inlet precursor concentration.

Figure 8:
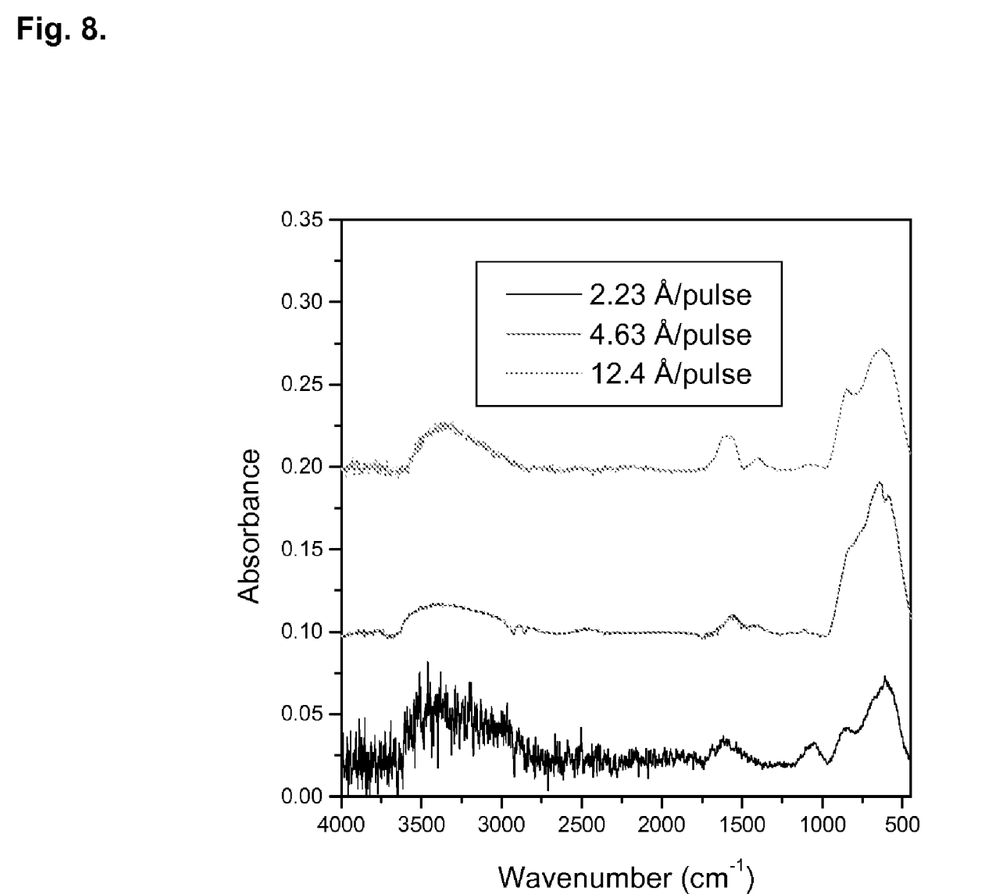
FIG. 8. FTIR spectra of pulsed PECVD $Al_2O_3$ films as a function of deposition rate.

Preliminary results have been obtained for this system. Through appropriate control of process variables self-limiting deposition rates between 1 and 15 Å/pulse have been obtained at room temperature. FIG. 8 shows FTIR spectra of films deposited at selected rates. These films display characteristics similar to films deposited by plasma-assisted ALD at room temperature (Niskanen, A., et al., 2005). Further characterization and process optimization is underway, nevertheless we have demonstrated that self-limiting deposition of $Al_2O_3$ is readily achieved through pulsed PECVD In conclusion, we have demonstrated that self-limiting deposition of both $Ta_2O_5$ and $Al_2O_3$ is readily achieved through pulsed PECVD. Self-limiting growth is assured when conditions are selected that result in no deposition under continuous operation with the plasma both on and off. The deposition rate may be easily controlled using simple process parameters, yielding materials with high purity and outstanding dielectric performance. The deposition kinetics were insensitive to substrate temperature over the range examined. Pulsed PECVD requires no purge cycles or gas actuation, and provides a practical alternative to ALD that is compatible with standard PECVD processing.

This invention has been illustrated by particular embodiments, however, various substitutions may be made of equivalents to the compositions, methods and apparatuses disclosed herein. The scope of the invention is limited only by the claims.

All publications referred to herein are incorporated herein by reference to the extent not inconsistent herewith.

REFERENCES

"Aviza rebuilding ALD presence in competitive market, Part 2," http://sst.pennnet.com/articles/article_display.cfm?Section=ARCHI&C=Feat&ARTICLE_ID=211736&KEYWORDS=ALD %20market&p=67, (2004).

"OLED market grew 65% to 61 million units in 2005, says Displaybank," http://www.digitimes.com/displays/a20060228PR205.html, (2006).

"OLEDs Replacing LCDs in Mobile Phones," http://www.reed-electronics.com/electronicnews/article/CA516009.html, (2005).

Alén, P., M. Vehkamäki, M. Ritala, and M. Leskelá, J. Electrochem. Soc. 153, G304 (2006).

Barnes, T., J. Leaf, C. Fry, and C. A. Wolden, "Room temperature chemical vapor deposition of c-axis ZnO," J. Cryst. Growth 274, 412 (2005).

Barnes, T. M., S. Hand, J. Leaf, and C. A. Wolden, "ZnO synthesis by high vacuum plasma-assisted chemical vapor deposition using dimethylzinc and atomic oxygen," J. Vac. Sci. Technol. A 22, 2118 (2004).

Bauer, M., T. Schwarz-Selinger, and W. Jacob, J. Appl. Phys. 98, 073302 (2005).

Biebericher, A. C. W., J. Bezemer, W. F. van der Weg, and W. J. Goedheer, Appl. Phys. Lett. 76, 2002 (2000).

Carcia, P. F., R. S. McLean, M. H. Reilly, M. D. Groner, and S. M. George, Appl. Phys. Lett. 89, 031915 (2006).

Charles, C., and R. W. Boswell, J. Appl. Phys. 84, 350 (1998).

Cho, B.-O. S. X. Lao, and J. P. Chang, J. Appl. Phys. 93, 9345 (2003).

Cho, M., D. S. Jeong, J. Park, H. B. Park, S. W. Lee, T. J. Park, C. S. Hwang, G. H. Jang, and J. Jeong, Appl. Phys. Lett. 85, 5953 (2004).

Cho, M., M., H. B. Park, J. Park, S. W. Lee, C. S. Hwang, J. Jeong, H. S. Kang, and Y. W. Kim, "Comparison of properties of an Al2O3 thin layers grown with remote O2 plasma, H2O, or O3 as oxidants in an ALD process for HfO2 gate dielectrics," J. Electrochem. Soc. 152, F49 (2005).

Chwang, A. B., M. A. Rothman, S. Y. Mao, R. H. Hewitt, M. S. Weaver, J. A. Silvernail, and N. Rutherford, "Thin film encapsulated flexible organic electorluminescent displays," Appl. Phys. Lett. 83, 413 (2003).

CompoundSemi News, "Shakeup Expected in ALD Equipment Business," http://www.compoundsemi.com/documents/articles/news/5844.html, (2005).

Electronics.ca Research Network, "The ALD Market Will Cross $617 Million by 2010," http://www.electronics.ca/PressCenter/articles/256/1/The-ALD-Market-Will-Cross-617-Million-By-2010.html, (2003).

Fujioka, Y., A. Shimizu, H. Fukuda, T. Oouchida, S. Tachibana, H. Tanamura, K. Nomotoa, K. Okamoto, and M. Abe, Solar Energy Mat. Solar Cells 90, 3416 (2006).

Genus, http://genus.com/markets/markets_semicon.html, (2001).

George, S. M., A. W. Ott, and J. W. Klaus, "Surface chemistry for atomic layer growth," J. Phys. Chem. 100, 13121 (1996).

Goodman, C. H. L., and M. V. Pessa, "Atomic layer epitaxy," J. Appl. Phys. 60, R65 (1986).

Goto, H., T. Takehara, C. A. Sorenson, W. R. Harshbarger, and K. S. Law, U.S. Pat. No. 6,451,390 (2002).

Heil, S. B. S., P. Kudlacek, E. Langereis, R. Engeln, M. C. M. van der Sanden, and W. M. M. Kessels, Appl. Phys. Lett. 89, 131505 (2006).

Higashi, G. S., and C. G. Fleming, "Sequential surface chemical reaction limited growth of high quality Al2O3 dielectrics," Appl. Phys. Lett. 55, 1963 (1989). J. J. Robbins, J. J., J. Esteban, C. Fry, and C. A. Wolden, J. Electrochem. Soc. 150, C693 (2003).

Jezewski, C., W. A. Lanford, C. J. Wiegand, J. P. Singh, P.-I. Wang, J. J. Senkevich, and T.-M Lu, "Inductively Coupled Hydrogen Plasma-Assisted Cu ALD on Metallic and Dielectric Surfaces," J. Electrochem. Soc. 152, C60 (2005).

Jiang, X., F. L. Wong, M. K. Fung, and S. T. Lee, "Aluminum-doped zinc oxide films as transparent conductive electrode for organic light emitting devices," Appl. Phys. Lett. 83, 1875 (2003).

Katsch, H. M., A. Tewes, E. Quandt, A. Goehlich, T. Kawetzki, and H. F. Dobele, "Detection of atomic oxygen: Improvement of actinometry and comparison with laser spectroscopy," J. Appl. Phys. 88, 6232 (2000).

Kim, D. H., Y. J. Kim, and Y. S. Song, "Characteristics of tungsten carbide films prepared by plasma-assisted ALD using bis(tert-butylimido)bis-(dimethylamido)tungsten," J. Electrochem. Soc. 150, C740 (2003).

Kim, J. B., D. R. Kwon, K. Chakrabati, C. Lee, K. Y. Oh, and J. H. Lee, J. Appl. Phys. 92, 6739 (2005).

Kukli, K., M. Ritala, and M. Lekela, J. Electrochem. Soc. 142, 1670 (1995).

Labelle, C. B., and K. K. Gleason, J. Vac. Sci. Technol. A 17, 445 (1999).

Lao, S. X., R. M. Martin, and J. P. Chang, "Plasma enhanced atomic layer deposition of HfO2 and ZrO2 high-k thin films," J. Vac. Sci. Technol. A 23, 488 (2005).

Lee, C. and M. A. Lieberman, "Global model of Ar, O2, C12, and Ar/O2 high density plasma discharges," J. Vac. Sci. Technol. A 13, 368 (1995).

Lee, C., D. B. Graves, M. A. Lieberman, and D. W. Hess, "Global model of plasma chemistry in a high density oxygen discharge," J. Electrochem. Soc. 141, 1546 (1994).

Lee, Y. H., J. C. Kwak, B. S. Gang, H. C. Kim, B. H. Choi, B. K. Jeong, S. H. Park, and K. H. Lee, J. Electrochem. Soc. 151, C52 (2004).

Lieberman M. A., and A. J. Lichtenberg, Principles of Plasma Discharges and Materials Processing. New York, N.Y.: John Wiley and Sons, Inc., 1994.

Lim, B. S., A. Rahtu, and R. G. Gordon, "Atomic layer deposition of transition metals," Nature Mater. 2, 749 (2003).

Look, D. C., D. C. Reynolds, J. R. Sizelove, R. L. Jones, C. W. Litton, G. Cantwell, and W. C. Harsch, "Electrical properties of bulk ZnO," Solid State Commun. 105, 399 (1998).

Mackie, N. M., N. F. Dalleska, D. G. Castner, and E. R. Fisher, Chem. Mater. 9, 349 (1997).

Maeng, W. J., and H. Kim, "Thermal and plasma-enhanced ALD of Ta and Ti oxide thin films from alkylamide precursors," Electrochem. Solid-State Lett. 9, G191 (2006).

Masuda, S., K. Kitamura, Y. Okumura, S. Miyatake, H. Tabata, and T. Kawai, "Transparent thin film transistors using ZnO as an active channel layer and their electrical properties," J. Appl. Phys. 93, 1624 (2003).

Mukherjee, C., C. Anandan, T. Seth, P. N. Dixit, and R. Bhattacharyya, Appl. Phys. Lett. 68, 194 (1996).

Niskanen, A., K. Aristala, M. Ritala, and M. Leskela, "Low-temperature deposition of aluminum oxide by radical enhanced atomic layer deposition," J. Electrochem. Soc. 152, F90 (2005).

Nguyen T., "Plasma enhanced pulsed layer deposition", U.S. Pat. No. 6,689,220 (2004). Simplus Systems Corporation.

Nomotoa, K. Okamoto, and M. Abe, Solar Energy Mat. Solar Cells 90, 3416 (2006).

Ono H., and K. Koyanagi, Appl. Phys. Lett. 77, 1431 (2000).

Ott, A. W., J. W. Klaus, J. M. Johnson, S. M. George, K. C. McCarley, and J. D. Way, "Modification of porous alumina membranes using Al2O3 atomic layer controlled deposition," Chem. Mater. 9, 707 (1997).

Overzet, L. J., and J. T. Verdeyen, Appl. Phys. Lett. 48, 695 (1986).

Park, J.-S, and S.-W. Kang, "Plasma-enhanced ALD of titanium-silicon-nitride using TiCl4, SiH4, and N2/H2/Ar plasma," Electrochem. Solid-State Lett. 7, C87 (2004).

Park, S. H. K., J. Oh, C. S. Hwang, J. I. Lee, Y. S. Yang, H. Y. Chu, and K. Y. Kang, "Ultra thin film encapsulation of organic light emitting diode on a plastic substrate," Etri Journal 27, 545 (2005).

Puurunen, R. L., "Surface chemistry of atomic layer deposition: A case study for the trimethylaluminum/water process," J. Appl. Phys. 97, 121301 (2005).

Ritala, M., K. Kukli, A. Rahtu, P. I. Raisanen, M. Leskela, T. Sajavaara, and J. Keinonen, "Atomic layer deposition of oxide thin films with metal alkoxides as the oxygen source," Science 288, 319 (2003).

Robbins, J. J., R. T. Alexander, M. Bai, Y.-J. Huang, T. L. Vincent, and C. A. Wolden, "Development of tin oxide synthesis by plasma-enhanced chemical vapor deposition," J. Vac. Sci. Technol. A 19, 2762 (2001).

Robbins, J. J., C. Fry, and C. A. Wolden, "An interrogation of the zinc oxide—gallium oxide phase space by plasma enhanced chemical vapor deposition," J. Cryst. Growth 263, 283 (2004).

Robbins, J. J., J. Esteban, C. Fry, and C. A. Wolden, "An investigation of the plasma chemistry involved in the synthesis of ZnO by plasma-enhanced chemical vapor deposition," J. Electrochem. Soc. 150, C693 (2003).

Robbins, J. J., J. Harvey, J. Leaf, C. Fry, and C. A. Wolden, "Transport phenomena in high performance nanocrystalline ZnO:Ga films," Thin Solid Films 473, 35 (2005).

Seman M., and C. A. Wolden, "An investigation of the role of plasma conditions on the deposition rate and electrochromic performance of tungsten oxide thin films," J. Vac. Sci. Technol. A 21, 1927 (2003).

Seman, M., J. Marino, W. Yang, and C. A. Wolden, "An investigation of the role of plasma conditions on the deposition rate of electrochromic vanadium oxide thin films," J. Non-Cryst. Solids 351, 1987 (2005).

Sneh, O, R. B. Clark-Phelps, A. R. Londergan, J. Winkler, and T. E. Seidel, "Thin film atomic layer deposition equipment for semiconductor processing," Thin Solid Films 402, 248 (2002).

Suntola T., and J. Anston, "Method for producing compound thin films" U.S. Pat. No. 4,058,430, (1977).

Szymanowski, H., O. Zabeida, J. E. Klemberg-Sapieha, and L. Martinu, J. Vac. Sci. Technol. A 23, 241 (2005).

Szymanowski, H., O. Zabeida, J. E. Klemberg-Sapieha, and L. Martinu, J. Vac. Sci. Technol. A 23, 241 (2005).

Vernhes, R., O. Zabeida, J. E. Klemberg-Sapieha, and L. Martinu, J. Appl. Phys. 100, 063308 (2006).

Wafer News, "Atomic layer deposition becomes the next imperative technology," http://sst.pennnet.com/articles/article_display.cfm?Section=ARCHI&C=Feat& ARTICLE_ID=232100&KEYWORDS=ALd&p=67, (2005).

Wolden, C. A., "The role of oxygen dissociation in plasma enhanced chemical vapor deposition of zinc oxide from oxygen and diethyl zinc," Plasma Chem. Plasma Process. 25, 169 (2005).

Yang W., and C. A. Wolden, "Plasma-enhanced chemical vapor deposition of TiO2 thin films for dielectric applications," Thin Solid Films 515, 1708 (2006).

Yun, S. J., K.-H. Lee, J. Skarp, H.-R. Kim, and K. S, Nam, "Dependence of atomic layer deposited Al2O3 film characteristics on growth temperature and Al precursors Al(CH3)3 and AlCl3," J. Vac. Sci. Technol. A 15, 2993 (1997).

The invention claimed is:

1. A pulsed plasma-enhanced chemical vapor deposition (PECVD) process for depositing a thin film of a, metal oxide on a substrate, the process comprising:
   a) providing at least one gaseous, metal-containing precursor compound to a PECVD reactor wherein the precursor compound is an organometallic compound, a metal halide or a metal hydride;
   b) providing to said reactor at least one additional gaseous reactant material, the gaseous reactant material containing oxygen;
   c) depositing the film of the metal oxide by pulsing a power supply to said reactor to create a power cycle consisting of a plasma OFF time and a plasma ON time;

wherein the process conditions are selected so that deposition of the metal oxide film is self-limiting during the plasma ON time and no thermal chemical vapor deposition of the metal oxide film occurs during the plasma OFF time.

2. The process of claim 1 wherein the metal-containing precursor and reactant material are continuously supplied to the reactor.

3. The process of claim 1 wherein said metal-containing precursor is an organometallic compound.

4. The process of claim 1 wherein said additional gaseous reactant material is—oxygen ($O_2$).

5. The process of claim 1 wherein said conditions are selected from the group consisting of temperature, pressure, power and precursor and reactant material composition, and combinations of any of the foregoing.

6. The process of claim 1 wherein the pulsed PECVD cycle time is ten second or less.

7. The process of claim 1 wherein the pulsed PECVD cycle time is one second or less.

8. The process of claim 1 wherein the pulsed PECVD cycle time is 0.1 second or less.

9. The process of claim 1 wherein the thickness of the film deposited on the substrate during a pulsed PECVD cycle is controllable.

10. The process of claim 1 wherein the thickness of the film deposited on the substrate during a pulsed PECVD cycle is 0.1 Å.

11. The process of claim 1 wherein the thickness of the film deposited on the substrate during a pulsed PECVD cycle is controllable from a thickness of 0.1 Å to about 10 Å.

12. The process of claim 1 wherein the total thickness of the film deposited on the substrate can be controlled by repeating the pulse sequence until the desired thickness is achieved.

13. The process of claim 1 wherein the substrate is selected from the group consisting of silicon, glass, metal and plastic.

14. The process of claim 1 wherein the substrate is a structured substrate.

15. The method of claim 1 wherein said metal-containing precursor is a metal halide.

16. The method of claim 1 wherein said metal-containing precursor is a metal hydride.

* * * * *